(12) United States Patent
Liu et al.

(10) Patent No.: US 11,278,893 B2
(45) Date of Patent: Mar. 22, 2022

(54) MICROFLUIDIC SUBSTRATE, DRIVING METHOD THEREOF, AND MICRO TOTAL ANALYSIS SYSTEM

(71) Applicant: BOE TECHNOLOGY GROUP CO., LTD., Beijing (CN)

(72) Inventors: Yingming Liu, Beijing (CN); Haisheng Wang, Beijing (CN); Xue Dong, Beijing (CN); Xiaoliang Ding, Beijing (CN); Chuncheng Che, Beijing (CN); Peizhi Cai, Beijing (CN); Pinchao Gu, Beijing (CN); Changfeng Li, Beijing (CN); Lei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/613,577

(22) PCT Filed: Sep. 14, 2018

(86) PCT No.: PCT/CN2018/105800
§ 371 (c)(1),
(2) Date: Nov. 14, 2019

(87) PCT Pub. No.: WO2019/200828
PCT Pub. Date: Oct. 24, 2019

(65) Prior Publication Data
US 2020/0061608 A1    Feb. 27, 2020

(30) Foreign Application Priority Data
Apr. 20, 2018 (CN) .......................... 201810360198.2

(51) Int. Cl.
*B01L 3/00* (2006.01)
*G01N 15/14* (2006.01)
(Continued)

(52) U.S. Cl.
CPC ..... *B01L 3/50273* (2013.01); *B01L 3/502792* (2013.01); *G01N 15/1484* (2013.01);
(Continued)

(58) Field of Classification Search
CPC ......... H01L 27/14612; H01L 27/14636; H01L 29/7391; H01L 29/786; H01L 27/1446;
(Continued)

(56) References Cited

U.S. PATENT DOCUMENTS

2010/0165534 A1    7/2010   Johnson et al.
2014/0231804 A1*   8/2014   Yan ................... H01L 27/14616
                                                        257/53
(Continued)

FOREIGN PATENT DOCUMENTS

CN      101166834 A      4/2008
CN      103412023 A     11/2013
(Continued)

OTHER PUBLICATIONS

International Search Report dated Jan. 17, 2019, issued in counterpart application No. PCT/CN2018/105800. (10 pages).
(Continued)

*Primary Examiner* — Dean Kwak
(74) *Attorney, Agent, or Firm* — Westerman, Hattori, Daniels & Adrian, LLP

(57) ABSTRACT

A microfluidic substrate and the driving method for the microfluidic substrate are provided. The microfluidic substrate may include a base substrate (10) and a plurality of detecting modules (100) on the base substrate (10). Each of the detecting modules (100) may include a switching unit (1), a driving electrode (3), and a photosensor (2). The photosensor (2) may have a first terminal (21) and a second terminal (23). A signal output terminal (13) of the switching
(Continued)

unit (1) may be connected to both the driving electrode (3) and the second terminal (23) of the photosensor (2).

17 Claims, 6 Drawing Sheets

(51) Int. Cl.
*G01N 15/10* (2006.01)
*H01L 27/144* (2006.01)

(52) U.S. Cl.
CPC ... *H01L 27/1446* (2013.01); *B01L 2300/0645* (2013.01); *B01L 2300/0663* (2013.01); *B01L 2300/12* (2013.01); *B01L 2300/165* (2013.01); *B01L 2400/0415* (2013.01)

(58) Field of Classification Search
CPC ....... B01L 2300/0645; B01L 3/502792; B01L 3/50273; B01L 2300/0627; B01L 2300/0636; B01L 2300/0663; B01L 2300/0887; B01L 2300/12; B01L 2300/165; B01L 2400/0415; B01L 2400/0427; B01L 3/502715; B01L 9/527; G01N 15/1484; G01N 2015/0693; G01N 33/5438
See application file for complete search history.

(56) References Cited

U.S. PATENT DOCUMENTS

| | | | |
|---|---|---|---|
| 2014/0320137 | A1 | 10/2014 | Liu et al. |
| 2016/0013243 | A1* | 1/2016 | O'Rourke ............. H01L 31/028 257/43 |
| 2019/0099756 | A1* | 4/2019 | Pang ................. B01L 3/502792 |

FOREIGN PATENT DOCUMENTS

| | | | |
|---|---|---|---|
| CN | 107497509 | A | 12/2017 |
| CN | 107527595 | A | 12/2017 |
| CN | 107607475 | A | 1/2018 |
| CN | 107754962 | A | 3/2018 |
| CN | 107790204 | A | 3/2018 |

OTHER PUBLICATIONS

Office Action dated Apr. 29, 2019, issued in counterpart CN application No. 201810360198.2, with English translation. (10 pages).

Office Action dated Sep. 25, 2019, issued in counterpart CN application No. 201810360198.2, with English translation. (7 pages).

* cited by examiner

MICROFLUIDIC SUBSTRATE, DRIVING METHOD THEREOF, AND MICRO TOTAL ANALYSIS SYSTEM

CROSS-REFERENCE TO RELATED APPLICATIONS

This application claims benefit of the filing date of Chinese Patent Application No. 20180360198.2 filed on Apr. 20, 2018, the disclosure of which is hereby incorporated in its entirety by reference.

TECHNICAL FIELD

The present disclosure relates to microfluidic technology, and particularly to a microfluidic substrate, a method for driving the microfluidic substrate, and a micro-total analysis system.

BACKGROUND

A micro-total analysis system can transfer function of an analytical laboratory to a portable analytical equipment through miniaturization and integration to a maximum degree such as a small chip. The ultimate goal is to achieve "portability" and "personalization" so that the scientific analytical equipment can be liberated from the analytical laboratories and enter into thousands of households.

The micro-total analysis system can control movement, separation, polymerization, chemical reaction, biological detection, and the like of the droplet. The driving electrode moves the droplet to a designated location. A light source is utilized to produce vertical light having different wavelengths through an optical waveguide and being emitted at a predetermined area of the optical waveguide. The photosensor detects change of the light after the droplet movement to determine location, composition and the like of the droplet.

BRIEF SUMMARY

An embodiment of the present disclosure provides a microfluidic substrate. The microfluidic substrate may include a base substrate and a plurality of detecting modules on the base substrate. Each of the detecting modules may include a switching unit, a driving electrode, and a photosensor having a first terminal and a second terminal. A signal output terminal of the switching unit may be connected to both the driving electrode and the second terminal of the photosensor. The first terminal and the second terminal of the photosensor may be sequentially disposed in a direction away from the base substrate.

The switching unit, the first terminal, a semiconductor junction, and the second terminal of the photosensor, and the driving electrode of each of the detecting modules may be sequentially stacked on the base substrate. A first insulating layer may be between the switching unit and the first terminal of the photosensor. A second insulating layer may be between the semiconductor junction and the driving electrode. The signal output terminal of the switching unit may be connected to the driving electrode through a first through hole in the first insulating layer and the second insulating layer. The driving electrode may be connected to the second terminal of the photosensor through a second through hole in the second insulating layer.

The switching unit may include a switching transistor. A source terminal of the switching transistor may be a signal input terminal of the switching unit and a drain terminal of the switching transistor may be the signal output terminal of the switching unit.

The plurality of detecting modules may be arranged in an array. Gates of switching transistors of a same row may be connected to a same gate line; and source terminals of switching transistors of a same column may be connected to a same data line.

The photosensor may include a PIN photodiode. A first terminal of the PIN photodiode may be the first terminal of the photosensor and a second terminal of the PIN photodiode may be the second terminal of the photosensor.

The semiconductor junction may include a N-type semiconductor layer, a I-type semiconductor layer, and a P-type semiconductor layer of the PIN photodiode being sequentially disposed in a direction away from the base substrate.

The microfluidic substrate may further include a planarization layer on the driving electrode and a hydrophobic material layer on the planarization layer. In one embodiment, the driving electrode and the second terminal of photosensor are shared as a unitary structure.

Another example of the present disclosure is a driving method for the microfluidic substrate according to one embodiment of the present disclosure. The driving method may include, during a droplet driving stage, turning on the switching unit, supplying a first voltage to the signal input terminal of the switching unit, and transmitting the first voltage to the driving electrode, turning off the switching unit, thereby driving movement of a droplet, and turning on the switching unit to supply a second voltage to a signal input terminal of the switching unit and release the first voltage from the driving electrode. The second voltage may be lower than the first voltage.

The driving method may further include, during a droplet detecting stage, providing a third voltage to the signal input terminal of the switching unit and transmitting the third voltage to the second terminal of the photosensor connecting to the signal output terminal of the switching unit, providing a fourth voltage to the other terminal of the photosensor, the fourth voltage being larger than the third voltage, turning off the switching unit and the photosensor converts light received to an electrical signal, and turning on the switching unit to read the electrical signal through the signal input terminal of the switching unit, thereby determining a status of the droplet.

In one embodiment, during the droplet driving stage, at the same time that the first voltage is provided to the signal input terminal of the switching unit, the first voltage is applied to the first terminal of the photosensor or the first terminal of the photosensor is floating.

In one embodiment, during the droplet driving stage, at the same time that the second voltage is provided to the signal input terminal of the switching unit, the second voltage is applied to the first terminal of the photosensor or the first terminal of the photosensor is floating.

Another example of the present disclosure is a micro-total analysis system. The micro-total analysis system may include the microfluidic substrate according to one embodiment of the present disclosure and an optical unit configured to emit light that irradiates the driving electrode. The optical unit may include a light source and an optical waveguide layer. The optical waveguide layer may be opposite the microfluidic substrate, and the light source may be disposed side by side with the optical waveguide layer.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the present disclosure are apparent from the following detailed description taken in conjunction with the accompanying drawings in which:

DETAILED DESCRIPTION

Figure 1A:
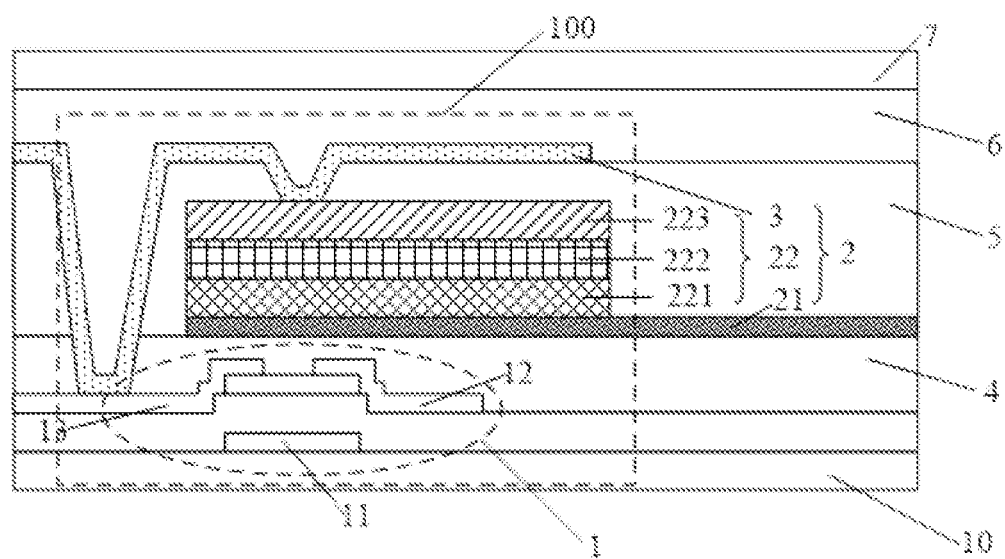
FIG. 1A is a schematic structural view of a microfluidic substrate according to one embodiment of the present disclosure.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-5. When referring to the figures, like structures and elements shown throughout are indicated with like reference numerals.

At presence, there are many challenges in the conventional micro-total analysis system. For example, a driving electrode that drives droplet movement and a photosensor that determines information such as location, composition and the like of the droplet each need a switching unit such as a switching transistor to control its working state. Furthermore, as the requirement for the size and composition of the droplet becomes more and more demanding, it is necessary to realize a high-resolution (pixel per inch) design. However, as described above, the present micro-total analysis systems need have two switching transistors and, as a result, require a larger space. Therefore, it is different to achieve the high-resolution in the conventional micro-total analysis system.

Accordingly, one embodiment of the present disclosure provides a microfluidic substrate. The microfluidic substrate includes a base substrate and a plurality of detecting modules on the base substrate. Each of the detecting modules includes a switching unit, a driving electrode, and a photosensor on the base substrate. The driving electrode is connected to a signal output terminal of the switching unit. A first terminal or a second terminal of the photosensor is also connected to the signal output terminal of the switching unit.

In the microfluidic substrates according to some embodiments of the present disclosure, the driving electrode and the photosensor of each of the detecting modules are connected to a same switching unit. Therefore, when the microfluidic substrate of the present disclosure is utilized in a micro-total analysis system, during the droplet driving stage, the switching unit is controlled to turn on, a first voltage is applied to a signal input terminal of the switching unit and transmitted to the driving electrode, and then the switching unit is controlled to turn off, thereby driving the droplet to move.

Then, the switching unit is turned on to supply a second voltage to the switching unit, releasing the first voltage in the driving electrode (that the first voltage can be released indicates that the second voltage is smaller than the first voltage). Once the voltage in the driving electrode is stabilized, the droplet detecting stage starts. Then, the switching unit remains on and a third voltage is supplied to the signal input terminal of the switching unit. The third voltage is then transmitted to one terminal of the photosensor connecting to the switching unit. A fourth voltage is supplied to the other terminal of the photosensor. Herein, the third voltage is smaller than the second voltage so that the droplet would not move. At the same time, the fourth voltage is larger than the third voltage. Then, the switching unit is controlled to be turned off, and the photosensor integrates and converts the received light signal into an electric signal. Lastly, the switching unit is controlled to be turned on again. Through reading the electric signal by the signal input terminal of the switching unit, a status of the droplet is determined. That is, information of the droplet regrading location and concentration of the droplet can be determined. It can be seen that the driving electrode and the photosensor of each of the detecting modules share a same switching unit to realize movement of the droplet and detection of the droplet to obtain information such as location and concentration of the droplet. Moreover, comparing to the current technology, more detecting modules can be disposed per unit area of a microfluidic substrate, which is advantageous for realizing a high-resolution microfluidic substrate.

Figure 1B:
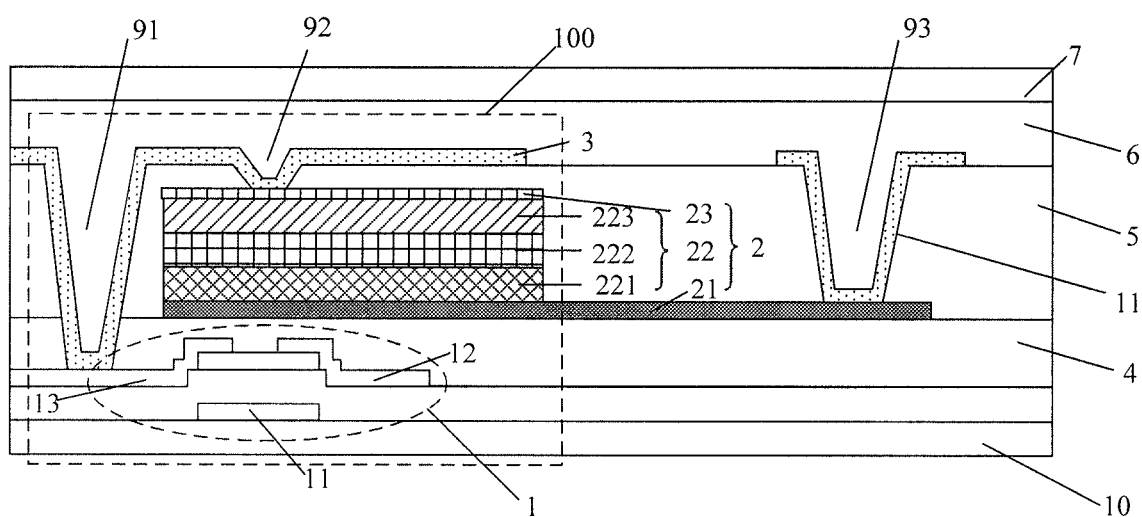
FIG. 1B is a schematic structural view of a microfluidic substrate according to one embodiment of the present disclosure.
Figure 2:
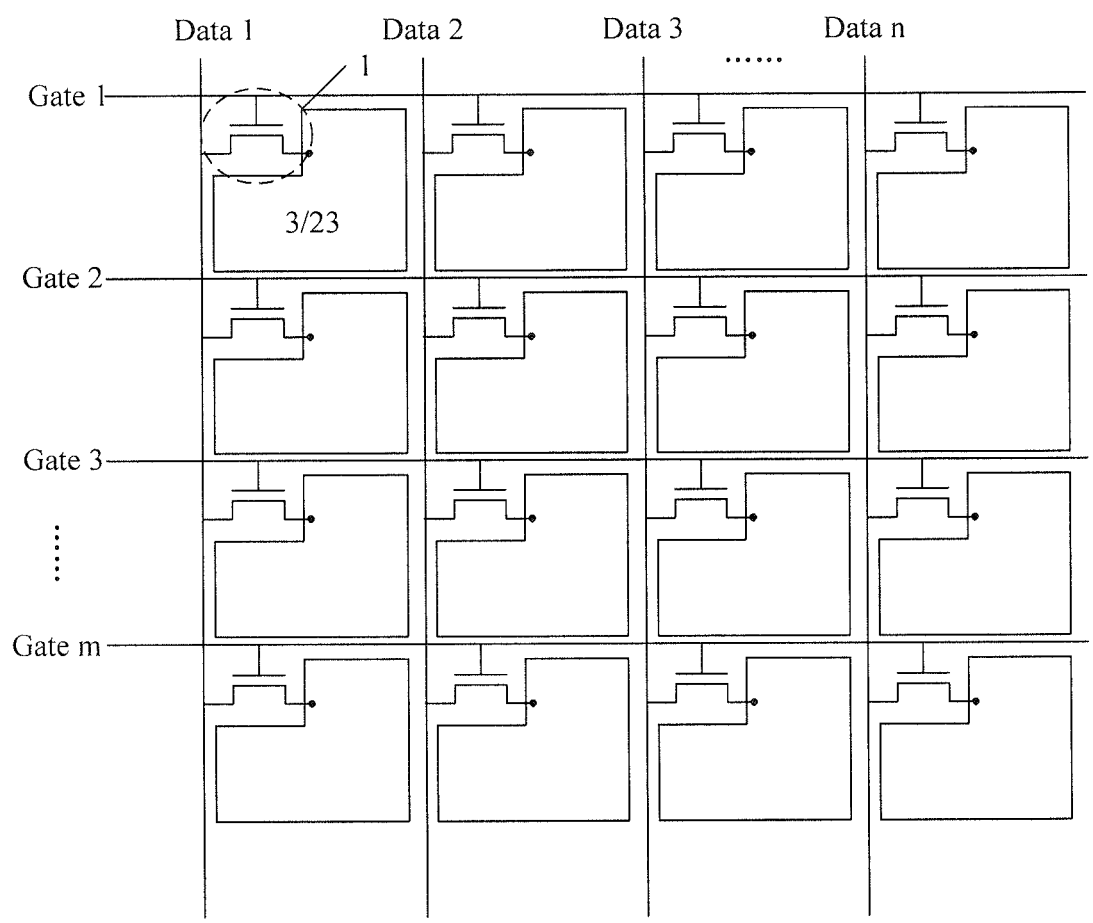
FIG. 2 is a plan view of a microfluidic substrate according to one embodiment of the present disclosure.

In one embodiment, as shown in FIGS. 1A, 1B and FIG. 2, in the microfluidic substrate, the first terminal and the second terminal of the photosensor are sequentially disposed in a direction away from the base substrate 10. In each of the detecting modules 100, the driving electrode 3 is time-multiplexed with the second terminal 23 of the photosensor such as a second PIN of the PIN photodiode 2 as shown in FIG. 1A. That is, the driving electrode 3 and the second PIN of the photosensor of each of the detecting modules 100 share the same structure. As such, the size of each of the detecting module 100 can be further reduced, which is more advantageous for achieving a high-resolution design.

In one embodiment, as shown in FIG. 1B, the driving electrode 3 is separate from the second terminal 23 of the photosensor. The driving electrode 3 is connected to the second terminal 23 of the photosensor through the second through hole 92. The Vd terminal 11 is connected to the first terminal of the photosensor through a third through hole 93. The Vd terminal 11 is used to provide voltage to the first terminal of the photosensor.

In one embodiment, the switching unit, the first terminal of the photosensor 21, the semiconductor junction, and the driving electrode 3 of each of the detecting modules 100 are stacked sequentially on the base substrate 10. A first insulating layer 4 is formed between the first terminal of the photosensor and the switching unit. A second insulating layer 5 is formed between the semiconductor junction of the photosensor and the driving electrode 3. The signal output terminal of the switching unit is connected to the driving electrode 3 through a first through hole 91 piercing through the first insulating layer 4 and the second insulating layer 5. The driving electrode 3 is connected to the semiconductor junction of the photosensor through a second through hole 92 piercing through the second insulating layer 5. Because the switching unit, the first terminal of the photosensor, the semiconductor junction, and the driving electrode 3 of each of the detecting modules 100 are stacked together, the size of each of the detecting modules 100 can be significantly reduced, thereby further enabling the high-resolution of the microfluidic substrate.

In one embodiment, the switching unit includes a switching transistor 1. A source terminal of the switching transistor 1 is configured as the signal input terminal of the switching unit, and a drain terminal of the switching transistor 1 is configured as the signal output terminal of the switching unit. The switching transistor 1 can be a P-type transistor or an N-type transistor. In the present embodiments, the N-type transistor is used for illustration purpose only.

In one embodiment, the detecting modules 100 are arranged in an array in order to have a better arrangement of the wiring. The gates of the switching transistors 1 of the same row are connected to a same gate line, and the source terminals of the switching transistors 1 of the same column are connected to a same data line.

In one embodiment, the photosensor is a PIN photodiode 2. A first terminal of the PIN photodiode is configured as the first terminal 21 of the photosensor. A second terminal of the PIN photodiode is configured as the second terminal 23 of the photosensor. An N-type semiconductor layer 221, an I-type semiconductor layer 222, and a P-type semiconductor layer 223 of the semiconductor junction 22 of the PIN photodiode are disposed sequentially in a direction away from the base substrate. In other words, the P-type semiconductor layer 223 is located closer to the light source 91. Such an arrangement is beneficial for switching the light signal. In another embodiment, the P-type semiconductor layer 223, the I-type semiconductor layer 222, the N-type semiconductor layer 221 can also be disposed sequentially in a direction away from the base substrate 10.

In one embodiment, the microfluidic substrate also includes a planarization layer 6 above the layer where the driving electrode 3 is located, and a hydrophobic material layer 7 above the planarization layer 6. In one embodiment, the hydrophobic material layer 7 includes a Teflon material or other insulating materials, which are not enumerated here. The hydrophobic material layer 7 can repel liquid, which is further advantageous for moving droplets.

In one embodiment, the microfluidic substrate also includes a first voltage supply unit and a second voltage supply unit. The first voltage supply unit is connected to the driving electrode 3 and the first terminal of the photosensor through the signal input terminal of the switching unit. Another terminal of the photosensor is connected to the second voltage supply unit. Different voltage signals can be provided by the first voltage supply unit and the second voltage supply unit to the driving electrode 3 and the photosensor during the droplet driving stage and the droplet detecting stage, thereby achieving droplet driving and status detection.

Figure 3:
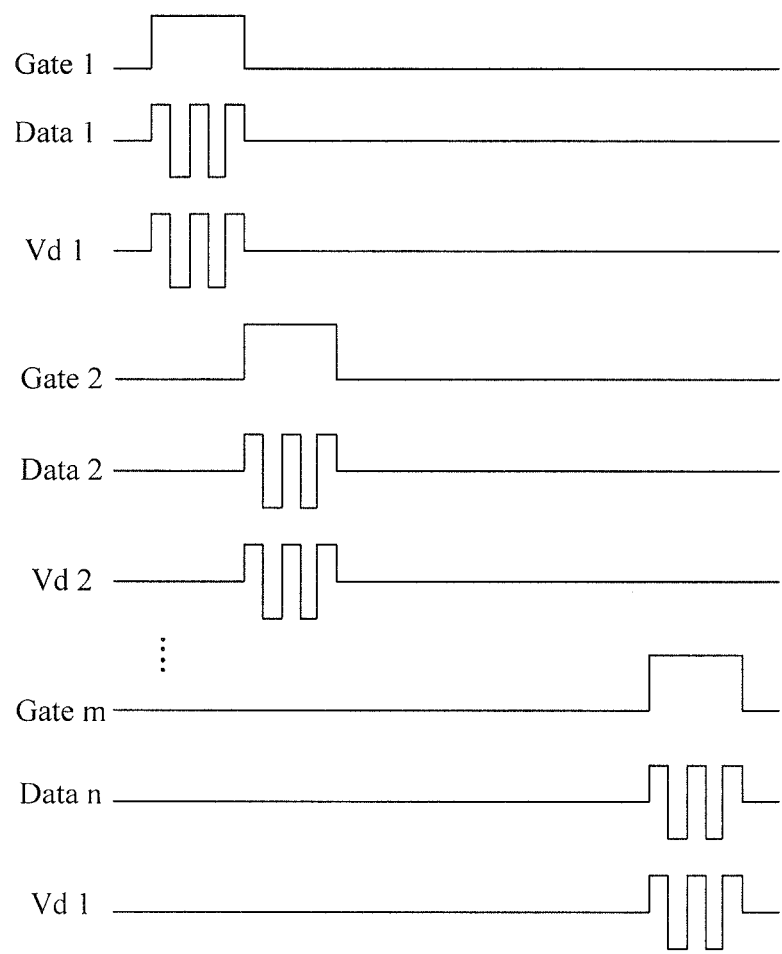
FIG. 3 is a timing chart of a droplet driving stage of a microfluidic substrate of one embodiment of the present disclosure.

In one embodiment, as shown in FIG. 1A, a switching transistor 1 is used as the switching unit. A PIN photodiode 2 is used as the photosensor. The driving electrode 3 and the second terminal 23 of PIN photodiode are shared. The gate, the active layer, the source terminal and the drain terminal of the switching transistor 1 are sequentially disposed on the base substrate 10. On the layer of the source terminal and the drain terminal of the switching transistor, a first insulating layer 4, a first terminal 21 of the PIN photodiode 2 (the first terminal is connected to Vd), an a N-type semiconductor layer 221, an I-type semiconductor layer 222, a P-type semiconductor layer 223 (the P-type semiconductor layer can also include an ITO protective layer), a second insulating layer 5, and the driving electrode 3 are sequentially disposed. The drain terminal of the switching transistor 1 is connected to the driving electrode through a first through hole in the first insulating layer 4 and the second insulating layer 5. The driving electrode 3 is connected to the P-type semiconductor layer 223 of the PIN photodiode 2 through a second through hole in the second insulating 5. The driving method of the microfluidic substrate according to one of the embodiment of the present disclosure is described below:

As shown in FIG. 3, during the droplet driving stage:

To drive the droplet, the switching transistor 1 controls the driving electrode 3 and provides different voltages to the driving electrode 3. The voltage of the driving electrode then causes the droplet above the driving electrode to have a different contact angle on the contacting surface, thereby realizing the droplet movement.

In one embodiment, as shown in FIG. 3, a high-level signal is inputted into the gate line. In other words, a high-level signal is inputted into the gate of the switching transistor 1 and the switching transistor 1 is turned on. A first voltage is then provided to the data line. That is, a first voltage (e.g. a high voltage) is provided to the source terminal of the switching transistor 1. Accordingly, the driving electrode 3 is supplied with the first voltage. Then, a low-level signal is inputted into the gate of the switching transistor 1 and the switching transistor 1 is turned off. The droplet is driven to move. Because the driving electrode 3 is multiplexed as the second terminal 23 of the PIN photodiode 2, to prevent the first voltage signal from damaging the PIN photodiode 2, a first voltage is applied to the first terminal 21 of the PIN photodiode 2. That is, a same first voltage is applied to the Vd terminal or the Vd terminal is floating.

After the first voltage is maintained at the driving electrode 3 for a period of time, the first voltage on the driving electrode is released and a second voltage (e.g., a low voltage) is provided to the source terminal of the switching transistor 1. During this time, a second voltage signal is also applied to the first terminal 21 of the PIN photodiode 2, that is, the second voltage is provided to the Vd terminal. The droplet detecting stage starts after the first voltage at the driving electrode is released.

Figure 4:
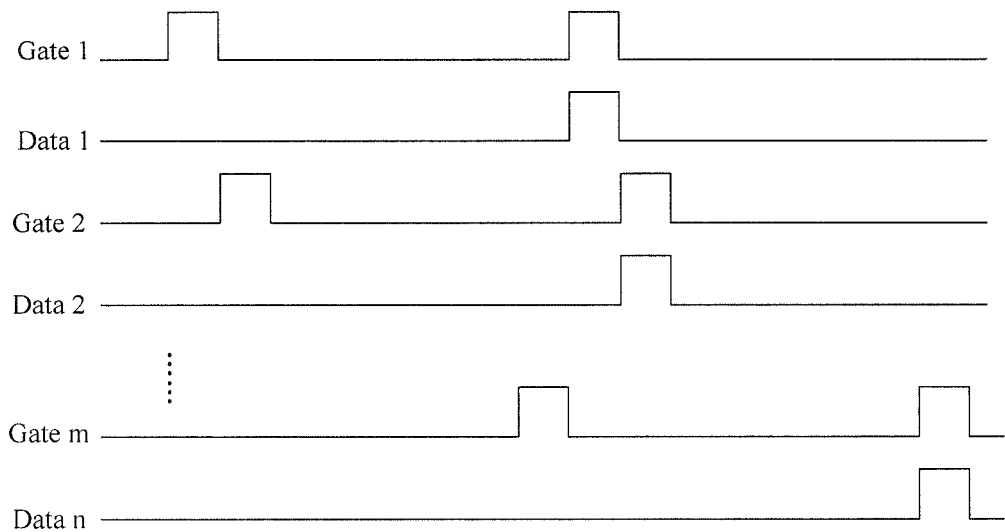
FIG. 4 is a timing chart of a droplet detecting stage of a microfluidic substrate of one embodiment of the present disclosure.

As shown in FIG. 4, during the droplet detecting stage:

A high-level signal is inputted to the gate line, that is, the high-level signal is inputted into the gate of the switching transistor 1 and the switching transistor 1 is turned on. A third voltage is supplied to the data line, that is, a third voltage (e.g., a low voltage) is supplied to the source terminal of the switching transistor 1. At this time, a fourth voltage is supplied to the first terminal 21 of the PIN photodiode 2 through the Vd terminal. The fourth voltage is higher than the third voltage. The reason that the third voltage supplied to the switching transistor 1 is a low voltage is because during the droplet detecting stage, the droplet should not move. A high voltage was supplied to the driving electrode 3 during the droplet driving stage to drive the movement of the droplet. Therefore, the third voltage should be a low voltage. Of course, the third voltage only needs to be smaller than the first voltage so that the droplet would not move. At this time, a low-level signal is inputted to the gate of the switching transistor 1 and turns off the switching transistor 1. When the PIN photodiode 2 is illuminated by light, the voltage difference between the terminals of the PIN photodiode 2 causes the PIN photodiode 2 to start sensitization integration and convert the light into an electrical signal. Once the integration process is completed, a high level signal is inputted to the gate of the switching transistor 1 and turns on the switching transistor 1. The electrical signal generated by the PIN photodiode 2 is read from the source terminal of the switching transistor 1. Accordingly, the status of the droplet is determined.

In this step, taking the PIN photodiodes 2 arranged in an array as an example, when the droplet moves to a certain location, the droplet can block a part of light above the droplet and causes a regional change of the signals received by the PIN photodiodes 2. As such, information regarding the size and location of the droplet can be detected. Furthermore, different concentrations of the droplet can block different amounts of the light above and causes the array of the PIN photodiodes 2 to produce different magnitudes of signals. As a result, the concentration information of the droplet can be determined real-time based on the signal magnitude.

It should be noted that the above embodiments use the signal output terminal of the switching unit to connect the second terminal 23 of the photosensor for illustration purpose only. Alternatively, the signal output terminal of the switching unit can also be connected to the first terminal 21 of the photosensor as long as the voltages being supplied to the first terminal 21 and the second terminal of the photosensor can be controlled during the droplet detecting stage.

Figure 5:
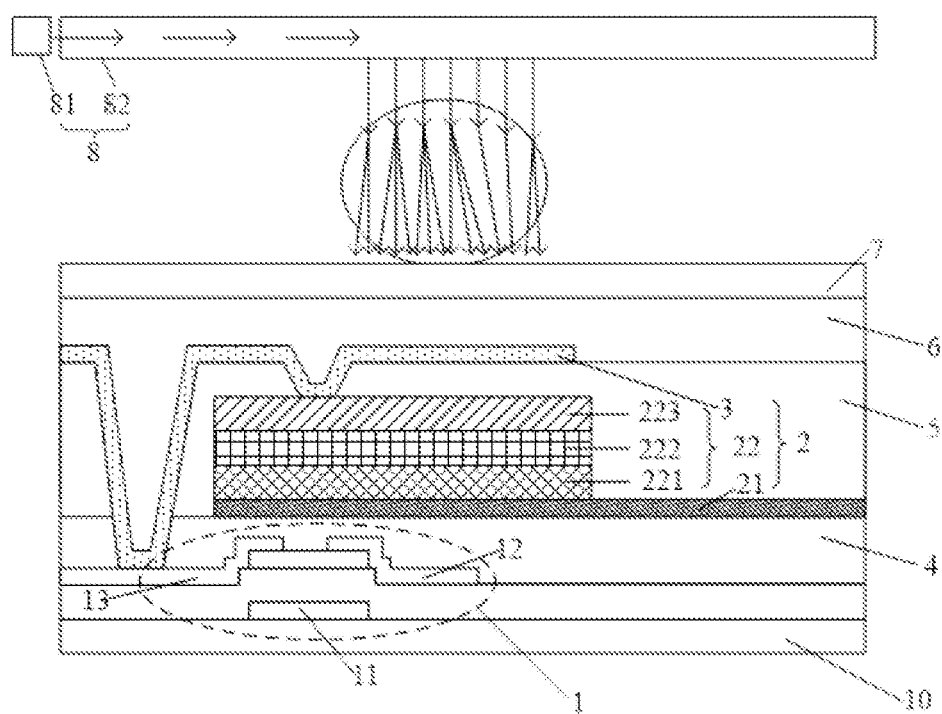
FIG. 5 is a schematic structural view of a micro-total analysis system according to one embodiment of the present disclosure.

Another example of the present disclosure provides a micro-total analysis system, as shown in FIG. 5. The micro-total analysis system includes the microfluidic substrate according to one embodiment of the present disclosure. Therefore, the micro-total analysis system can realize a high resolution.

In one embodiment, the micro-total analysis system of the present disclosure also includes a photosensitive unit 8 which is configured to emit light that irradiates the driving electrode 3. The photosensitive unit 8 includes a light source 81 and an optical waveguide layer 82. In one embodiment, the light source 81 is located at a side of the optical waveguide layer 82 and can emit light having different wavelengths. The optical waveguide layer 82 and the microfluidic substrate are opposite from each other.

As shown in FIG. 5, during the droplet driving stage and the droplet detecting stage, the droplet is located between the microfluidic substrate and the photosensitive unit 8. In one embodiment, the voltage applied to the driving electrode is controlled to realize the movement of the droplet. When the droplet is driven to a certain location, the droplet can block a part of light above the droplet and causes a regional change of the signals received by the photosensors. Therefore, information regarding the size and the location of the droplet can be detected. Furthermore, different concentrations of the droplet can block different amount of the light above and causes the array of the PIN photodiodes 2 to produce different magnitudes of signals. As a result, the concentration information of the droplet can be determined real-time based on the signal magnitude.

The principle and the embodiment of the present disclosures are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

The reference numbers in the figures are: substrate 10, switching transistor 1; PIN photodiode 2, first terminal of PIN photodiode 21, semiconductor junction 22; N-type semiconductor layer 221; I-type semiconductor layer 222; P-type semiconductor layer 223; second terminal of PIN photodiode 23; driving electrode 3; first insulating layer 4; second insulating layer 5; planarization layer 6; hydrophobic material layer 7; optical unit 8, light source 81; optical waveguide layer 82.

What is claimed is:

1. A microfluidic substrate, comprising:
a base substrate; and
a plurality of detecting modules on the base substrate, each of the detecting modules comprising a switching unit, a driving electrode, and a photosensor,
wherein the driving electrode is directly connected to both a signal output terminal of the switching unit and the photosensor, and a voltage is supplied to the driving electrode for driving a droplet in a droplet driving stage; and
the switching unit includes a switching transistor, the photosensor includes a PIN (P-type semiconductor, I-type semiconductor, N-type semiconductor) photodiode, and the switching transistor is disposed underneath the PIN photodiode.

2. The microfluidic substrate according to claim 1, wherein the photosensor comprises a first terminal.

3. The microfluidic substrate according to claim 2, wherein the switching unit, the first terminal, a semiconductor junction, and the driving electrode are sequentially stacked on the base substrate;
a first insulating layer is between the switching unit and the first terminal of the photosensor;
a second insulating layer is between the semiconductor junction and the driving electrode;
the signal output terminal of the switching unit is connected to the driving electrode through a first through hole in the first insulating layer and the second insulating layer; and
the driving electrode is connected to the photosensor through a second through hole in the second insulating layer.

4. The microfluidic substrate according to claim 1, wherein a source terminal of the switching transistor is a signal input terminal of the switching unit and a drain terminal of the switching transistor is the signal output terminal of the switching unit.

5. The microfluidic substrate according to claim 4, wherein switching transistors in the plurality of detecting modules are arranged in an array,
wherein gates of the switching transistors of a same row are connected to a same gate line; and source terminals of the switching transistors of a same column are connected to a same data line.

6. The microfluidic substrate according to claim 2, wherein the first terminal of the photosensor is a first terminal of the PIN photodiode.

7. The microfluidic substrate according to claim 3, wherein the semiconductor junction comprises a N-type semiconductor layer, a I-type semiconductor layer, and a P-type semiconductor layer of the PIN photodiode being sequentially disposed in a direction away from the base substrate, the P-type semiconductor is the P-type semiconductor layer, the I-type semiconductor is the I-type semiconductor layer, and the N-type semiconductor is the N-type semiconductor layer.

8. The microfluidic substrate according to claim 1, further comprising a planarization layer on the driving electrode and a hydrophobic material layer on the planarization layer.

9. The microfluidic substrate according to claim 1, wherein the driving electrode and a second terminal of photosensor are shared as a unitary structure.

10. A driving method for a microfluidic substrate, wherein the microfluidic substrate comprises:
a base substrate; and
a plurality of detecting modules on the base substrate, each of the detecting modules comprising a switching unit, a driving electrode, and a photosensor,
wherein the driving electrode is directly connected to both a signal output terminal of the switching unit and the photosensor, and a voltage is supplied to the driving electrode for driving a droplet in a droplet driving stage; and
the switching unit includes a switching transistor, the photosensor includes a PIN (P-type semiconductor, I-type semiconductor, N-type semiconductor) photodiode, and the switching transistor is disposed underneath the PIN photodiode; and
the driving method comprises, during the droplet driving stage,
turning on the switching unit, supplying a first voltage to a signal input terminal of the switching unit, and transmitting the first voltage to the driving electrode;
turning off the switching unit, thereby driving movement of the droplet; and
turning on the switching unit to supply a second voltage to the signal input terminal of the switching unit and release the first voltage from the driving electrode.

11. The driving method for the microfluidic substrate according to claim 10, wherein the second voltage is lower than the first voltage.

12. The driving method for the microfluidic substrate according to claim 10, further comprising, during a droplet detecting stage:
providing a third voltage to the signal input terminal of the switching unit and transmitting the third voltage to a second terminal of the photosensor connecting to the signal output terminal of the switching unit;
providing a fourth voltage to a first terminal of the photosensor, the fourth voltage being larger than the third voltage;
turning off the switching unit and the photosensor converts light received to an electrical signal; and
turning on the switching unit to read the electrical signal through the signal input terminal of the switching unit, thereby determining a status of the droplet.

13. The driving method for the microfluidic substrate according to claim 10, wherein, during the droplet driving stage, at same time that the first voltage is provided to the signal input terminal of the switching unit, the first voltage is applied to a first terminal of the photosensor or the first terminal of the photosensor is floating.

14. The driving method for the microfluidic substrate according to claim 10, wherein, during the droplet driving stage, at same time that the second voltage is provided to the signal input terminal of the switching unit, the second voltage is applied to a first terminal of the photosensor or the first terminal of the photosensor is floating.

15. A micro-total analysis system, comprising a microfluidic substrate, wherein the microfluidic substrate comprises:
a base substrate; and
a plurality of detecting modules on the base substrate, each of the detecting modules comprising a switching unit, a driving electrode, and a photosensor,
wherein the driving electrode is directly connected to both a signal output terminal of the switching unit and the photosensor, and a voltage is supplied to the driving electrode for driving a droplet in a droplet driving stage; and
the switching unit includes a switching transistor, the photosensor includes a PIN (P-type semiconductor, I-type semiconductor, N-type semiconductor) photodiode, and the switching transistor is disposed underneath the PIN photodiode; and
the micro-total analysis system further comprises an optical unit configured to emit light that irradiates the driving electrode.

16. The micro-total analysis system according to claim 15, wherein the optical unit comprises a light source and an optical waveguide layer.

17. The micro-total analysis system according to claim 16, wherein the optical waveguide layer is opposite the microfluidic substrate, and the light source is disposed side by side with the optical waveguide layer.

* * * * *